United States Patent
Feng

(10) Patent No.: US 6,961,008 B2
(45) Date of Patent: Nov. 1, 2005

(54) SCAN CIRCUIT AND METHOD FOR KEYBOARD

(75) Inventor: Ching-Hsiang Feng, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 630 days.

(21) Appl. No.: 10/174,018

(22) Filed: Jun. 18, 2002

(65) Prior Publication Data
US 2003/0179111 A1 Sep. 25, 2003

(30) Foreign Application Priority Data
Mar. 22, 2002 (TW) .......................... 91105656 A

(51) Int. Cl.[7] .......................... H03K 17/94; H03M 11/00
(52) U.S. Cl. .......................... 341/26; 84/655
(58) Field of Search .............................. 341/26, 20, 22; 84/478, 629, 655, 682

(56) References Cited

U.S. PATENT DOCUMENTS 3,746,773 A * 7/1973 Uetrecht ...................... 84/655
3,794,748 A * 2/1974 Deutsch ........................ 84/629
3,881,390 A * 5/1975 Gullickson .................... 84/478
5,367,119 A * 11/1994 Matsuda et al. .............. 84/617
5,541,989 A * 7/1996 Wu et al. ..................... 379/368

* cited by examiner

Primary Examiner—Timothy Edwards, Jr.
(74) Attorney, Agent, or Firm—Volpe and Koenig, P.C.

(57) ABSTRACT

A keyboard scan circuit for a device receiving plural inputs simultaneously is provided. The scan circuit includes a plurality of keyboard input/output ports, each of which can be selected from a group consisting of an input mode, an output mode, and a floating mode for receiving one of a plural inputs, a plurality of rectangular matrices including a plurality of detectable input terminals and a plurality of synchronously detectable input terminals and formed by means of cross-linking the keyboard input/output ports, and a plurality of current-isolating elements electrically connected between the keyboard input/output ports and the rectangular matrices for mutually isolating signals of the rectangular matrices.

14 Claims, 8 Drawing Sheets

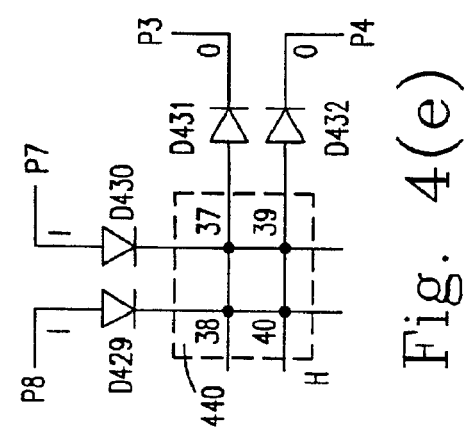
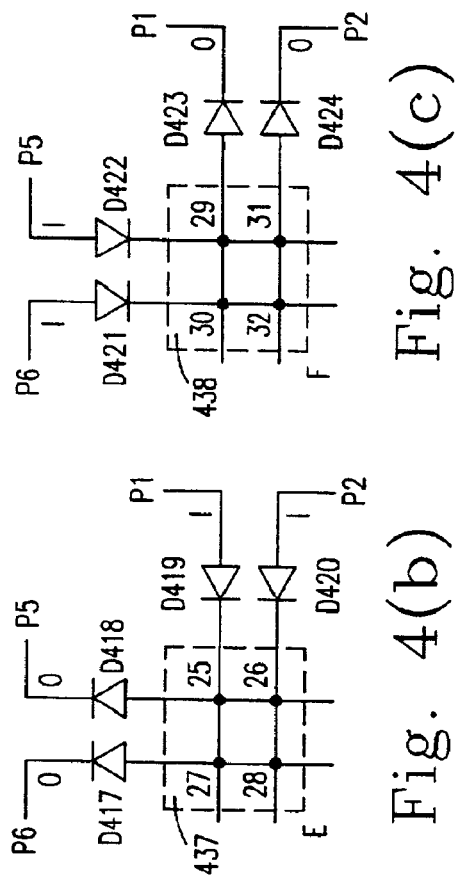
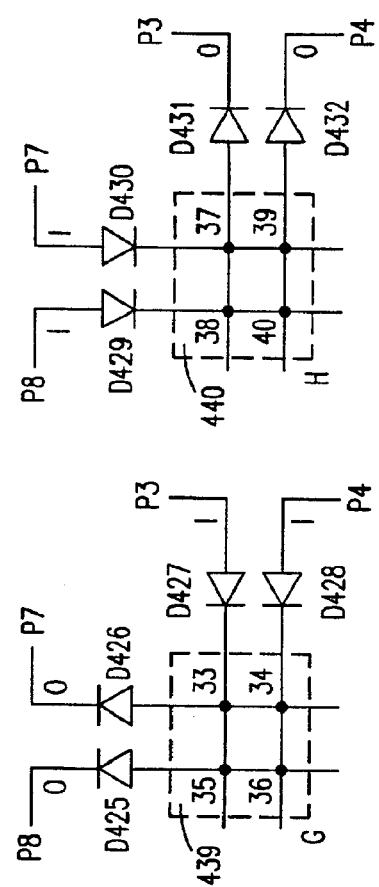
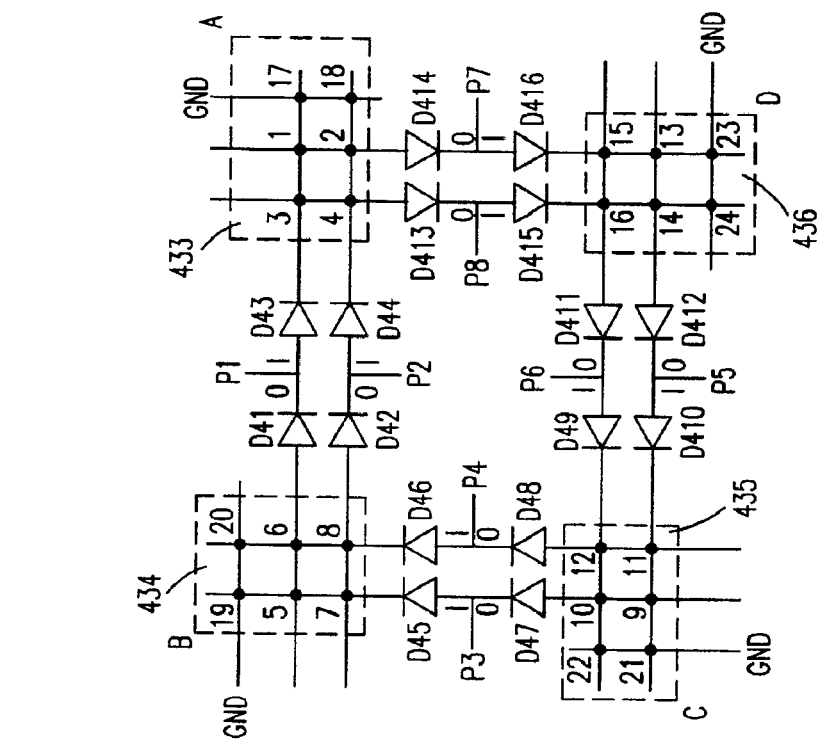
Fig. 4(a) Fig. 4(b) Fig. 4(c) Fig. 4(d) Fig. 4(e)

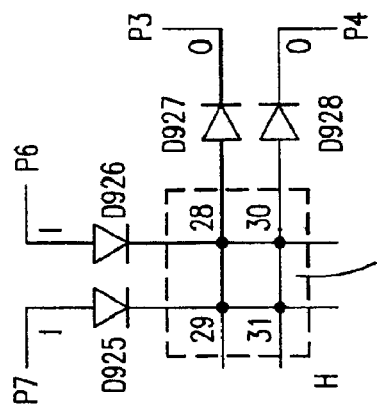
Fig. 9(c)
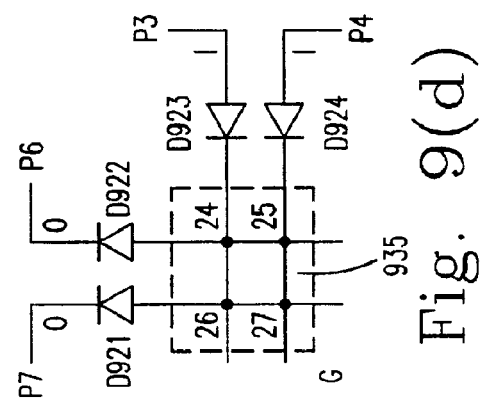
Fig. 9(e)
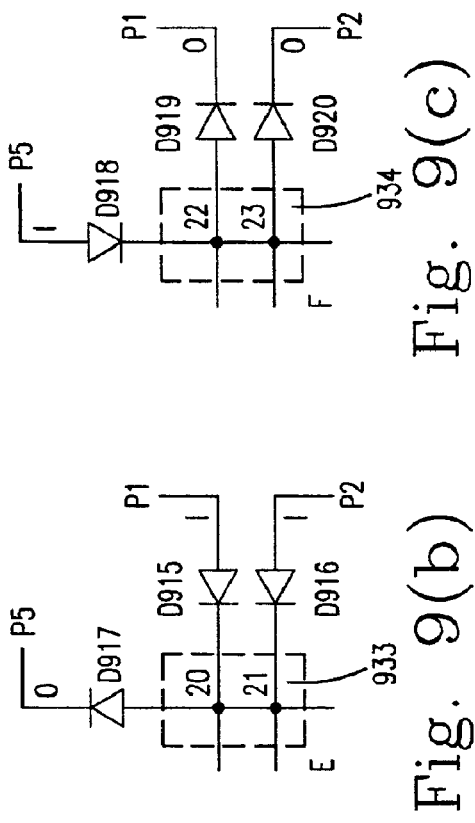
Fig. 9(b)
Fig. 9(d)
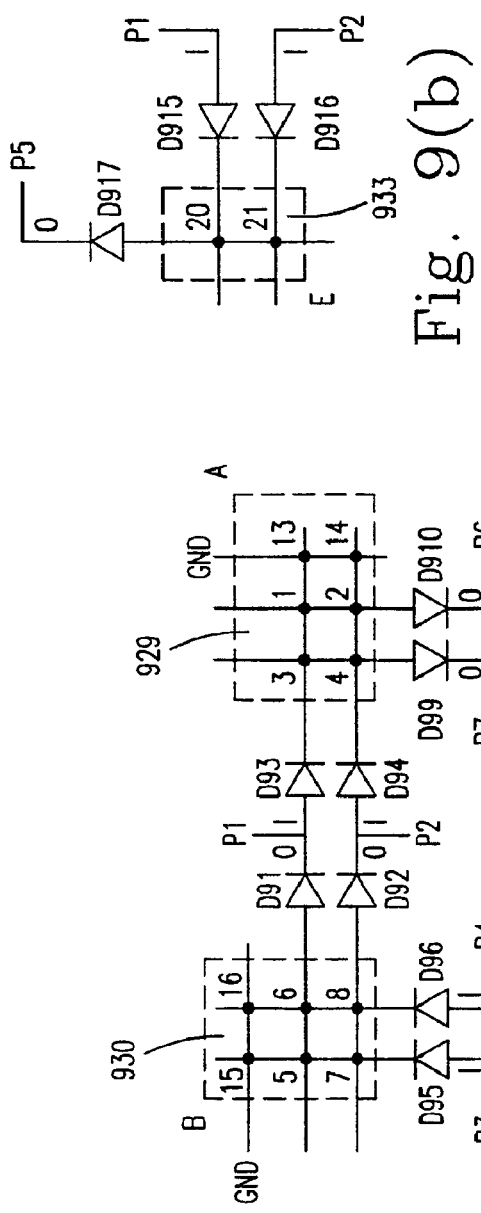
Fig. 9(a)

SCAN CIRCUIT AND METHOD FOR KEYBOARD

FIELD OF THE INVENTION

This invention relates to a scan circuit and a method for a keyboard, and more particularly to a scan circuit and a method for a device synchronously receiving inputs.

BACKGROUND OF THE INVENTION

Nowadays, input/output ports of a microprocessor chip are widely used in a maximal matrix keyboard scan operation of a keyboard. On the chip, the input/output ports are used to execute the maximal matrix keyboard scan for controlling keys of the electronic organ. But under this condition, the keyboard input/output ports only can receive two inputs at the same time. If a third input is received from the keyboard, an error result of the keyboard scan might appear.

Please refer to FIG. 1. FIG. 1 shows the schematical view of the circuit of the prior art. FIG. 1 shows a 4×4 matrix 11 which is formed by means of cross-linking eight input/output ports, and thus there are sixteen inputs in the matrix 11. When any one of the sixteen inputs is pressed, the corresponding horizontal and vertical lines will electrically be conducted and then the input can be read by the chip 10, which is the theory applied to a keyboard scan. But there exists a defect in the keyboard scan circuit. The defect is that only two inputs can be pressed synchronously. If the third input is pressed and its position forms a right triangle with theses of the previous two pressed inputs, the corresponding fourth input will be scanned definitely and thereby an error decision will be produced. For example, when an user inputs a key 2, a key 3, and a key 7, consequently a key 6 will also be scanned automatically by the scanning program even though the user didn't input it. Thus there brings an error decision. This is a blind spot in the traditional keyboard scan circuit.

Because of the technical defects described above, the applicant keeps on carving unflaggingly to develop "scan circuit and method for keyboard" through wholehearted experience and research.

SUMMARY OF THE INVENTION

It is an object of the present invention to provide a scan circuit and a method for keyboard inputs.

It is another object of the present invention to provide a scan circuit and a method for increasing the detectable input terminals and synchronously detectable input terminals in a keyboard.

It is another further object of the present invention to provide a three-dimensional circuit for being distinct from the traditional flat circuit to increase the simultaneous receiving inputs of a keyboard, but not to increase the cost.

The present invention provides a keyboard scan circuit for a device receiving plural inputs simultaneously. According to an aspect of the present invention, the scan circuit includes a plurality of keyboard input/output ports, each of which can be selected from a group consisting of an input mode, an output mode, and a floating mode for receiving one of the plural inputs, a plurality of rectangular matrices including a plurality of detectable input terminals and a plurality of synchronously detectable input terminals and formed by means of cross-linking the keyboard input/output ports, and a plurality of current-isolating elements electrically connected between the keyboard input/output ports and the rectangular matrices for mutually isolating signals of the rectangular matrices.

Preferably, the scan circuit further includes a ground terminal for forming the rectangular matrices by means of cross-linking the keyboard input/output ports therewith, so as to increase the number the detectable input terminals.

Preferably, the device providing keys to be operated simultaneously is an electronic organ with black and white keys.

Preferably, a plurality of keyboard input/output ports are those on a chip.

Preferably, a plurality of current-isolating elements are diodes.

Preferably, when the number the keyboard input/output ports is m, the number the diodes is 2m while a range of m is from two to six; and the number of the diodes is 4m while the number m is more than seven.

Preferably, the diodes operated under a one-way conductance characteristic mutually isolated signals of a plurality of rectangular matrices.

In accordance with another aspect of the present invention, a keyboard scan method for a device having keys to be operated simultaneously to receive plural inputs simultaneously includes a keyboard scan circuit having a plurality of keyboard input/output ports, ground terminals, a plurality of rectangular matrices having plurality input terminals and formed by means of cross-linking the keyboard input/output ports, and a plurality of current-isolating elements electrically connected between the keyboard input/output ports and the rectangular matrices. The method includes steps of: selecting one of a plurality of rectangular matrices to be scanned; setting one portion of the keyboard input/output ports in an input mode, setting another portion of the ports in an output mode, and setting the others of the ports in a floating mode; scanning the input terminals of the rectangular matrix linking with the ground terminal at a first time period; scanning the input terminals of the rectangular matrix unlinking with the ground terminal at a second time period; checking the keyboard input/output ports which were set to the input mode and determining which the keys are pressed according to an electrical potential difference produced by the ports in the input mode; and repeating the steps described above, so as to scan the rectangular matrices one by one.

Preferably, the device providing keys to be operated simultaneously is an electronic organ with black and white keys.

Preferably, a plurality of keyboard input/output ports are those on a chip.

Preferably, a plurality of current-isolating elements are diodes.

Preferably, when the number the keyboard input/output ports is m, the number the diodes is 2m while a range of m is from two to six; and the number of the diodes is 4m while the number m is more than seven.

Preferably, the diodes operated under a one-way conductance characteristic mutually isolated signals of a plurality of rectangular matrices.

Preferably, the input terminals of the rectangular matrices unlinking with the ground terminals are synchronously detectable input terminals.

The above objects and advantages of the present invention will become more readily apparent to those ordinarily skilled in the art after reviewing the following detailed descriptions and accompanying drawings, in which:

BRIEF DESCRIPTION OF THE DRAWINGS

FIGS. 4(a)–4(e) show schematical views of a circuit in a preferred embodiment according to the present invention when the number of the keyboard input/outputs is eight;

FIGS. 9(a)–9(e) show schematical views of a circuit in another preferred embodiment according to the present invention when the number of the keyboard input/output is seven.

DETAILED DESCRIPTION OF THE PREFERRED EMBODIMENT

Figure 1:
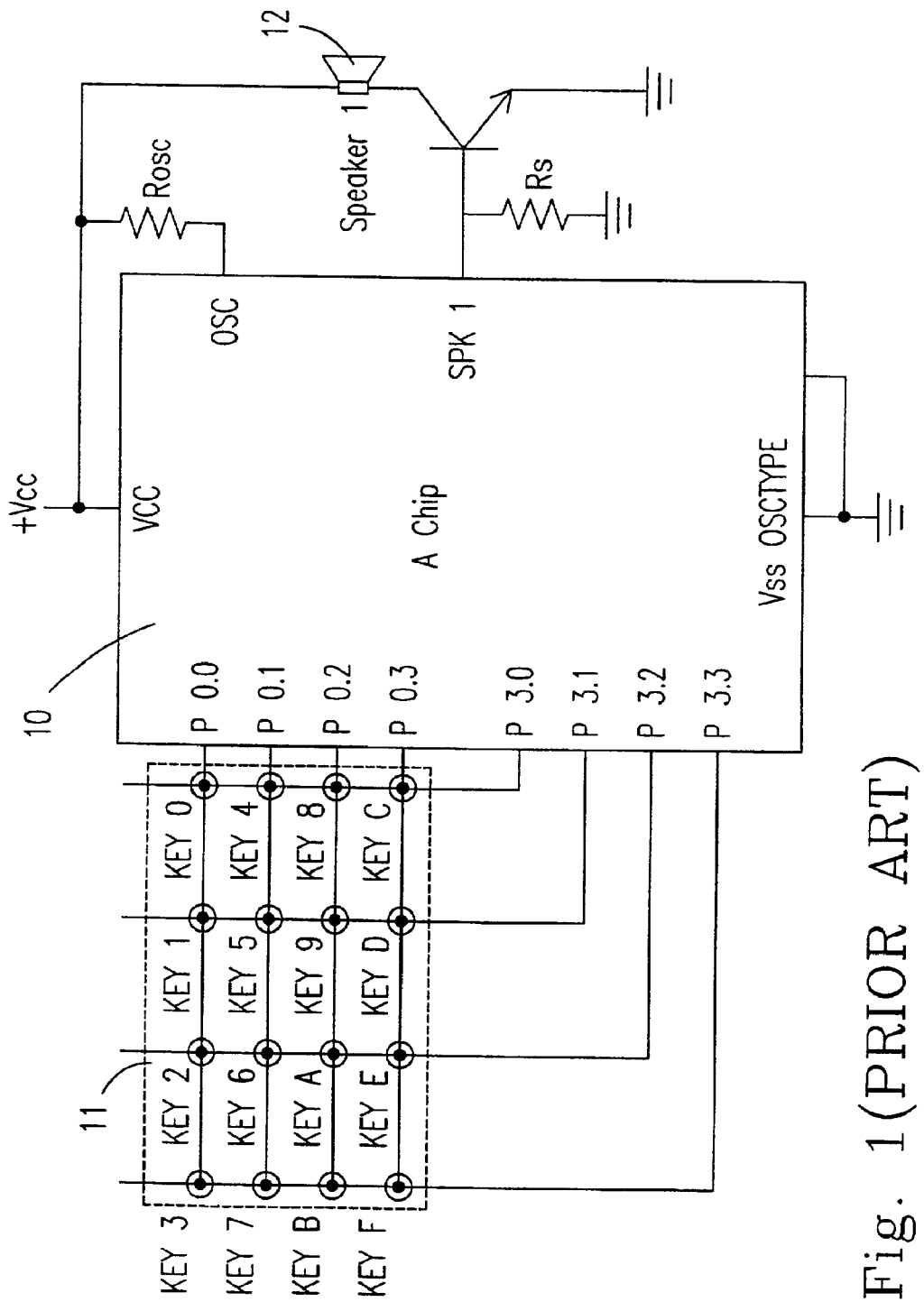
FIG. 1 shows a schematical view of a circuit in the prior art.
Figure 2:
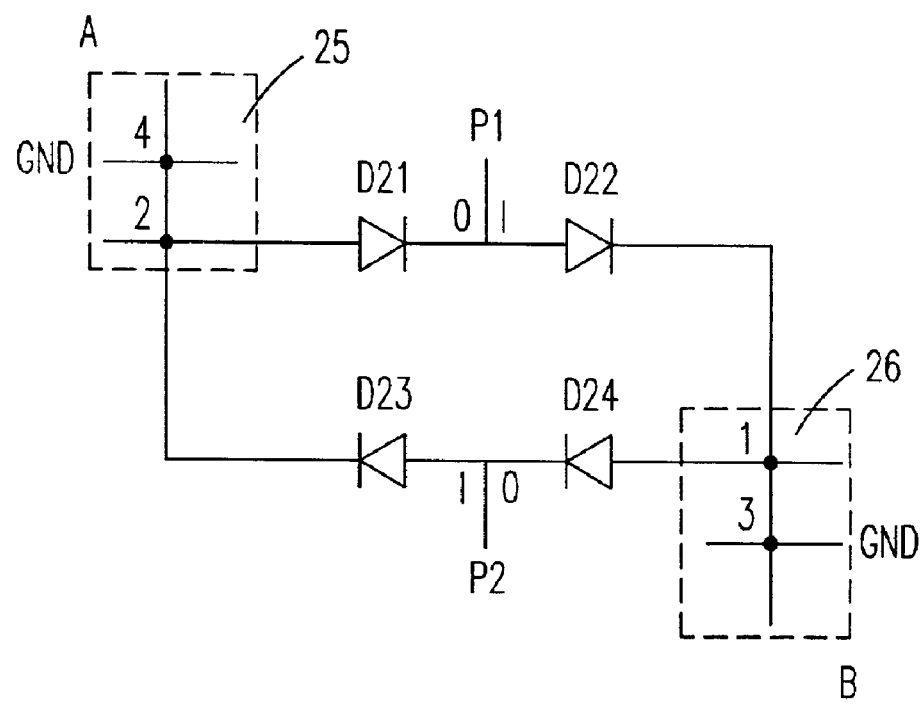
FIG. 2 shows a schematical view of a circuit of the minimal scan cell according to the present invention.

Please refer to FIG. 2. FIG. 2 shows a schematical view of the smallest scan cell circuit in the keyboard scan circuit. The scan cell is constituted by two keyboard input/output ports (P1 and P2), each of which can be selected from a group consisting of an input mode, an output mode, and a floating mode, and four diodes (D21~D24) to form two rectangular matrices (25 and 26) in which there are four detectable input terminals (1~4) and two synchronously detectable input terminals (1 and 2) therein.

Assuming that the scan time is separated to T1, T2, T3, and T4, P1 is set in the output mode, and P2 is set in the input mode while the times are at T1 and T2. Consequently, the matrix A (25) will be scanned firstly, so that the terminal 4 will be detected at T1 and the terminal 2 will be detected at T2. Continuously, P1 is set in the input mode, and P2 is set in the output mode while the times are at T3 and T4. Then, the matrix B (26) will be scanned at this moment, so that the terminal 3 will be detected at T3, and the terminal 1 will be detected at T4. Because of the diodes (D21~D24) in the matrix A (25) and matrix B (26) being the current-ioslating elements, the terminal (1) in the matrix B (26) will not be influenced when the terminal (2) in the matrix A (25) is under operation, and the purpose of synchronously input can be achieved thereby.

Figure 3:
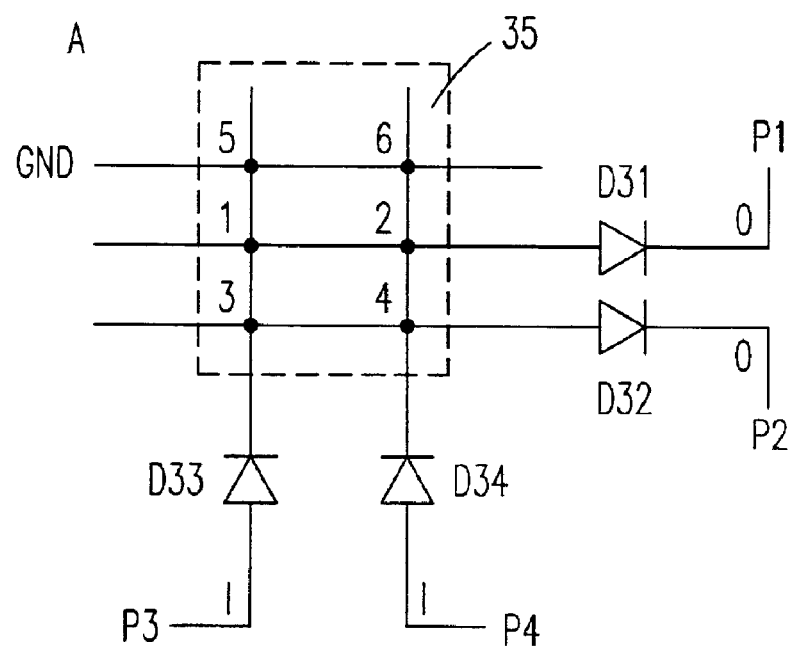
FIG. 3 shows a schematical view of a circuit of the minimal scan matrix according to the present invention.
Figure 5:
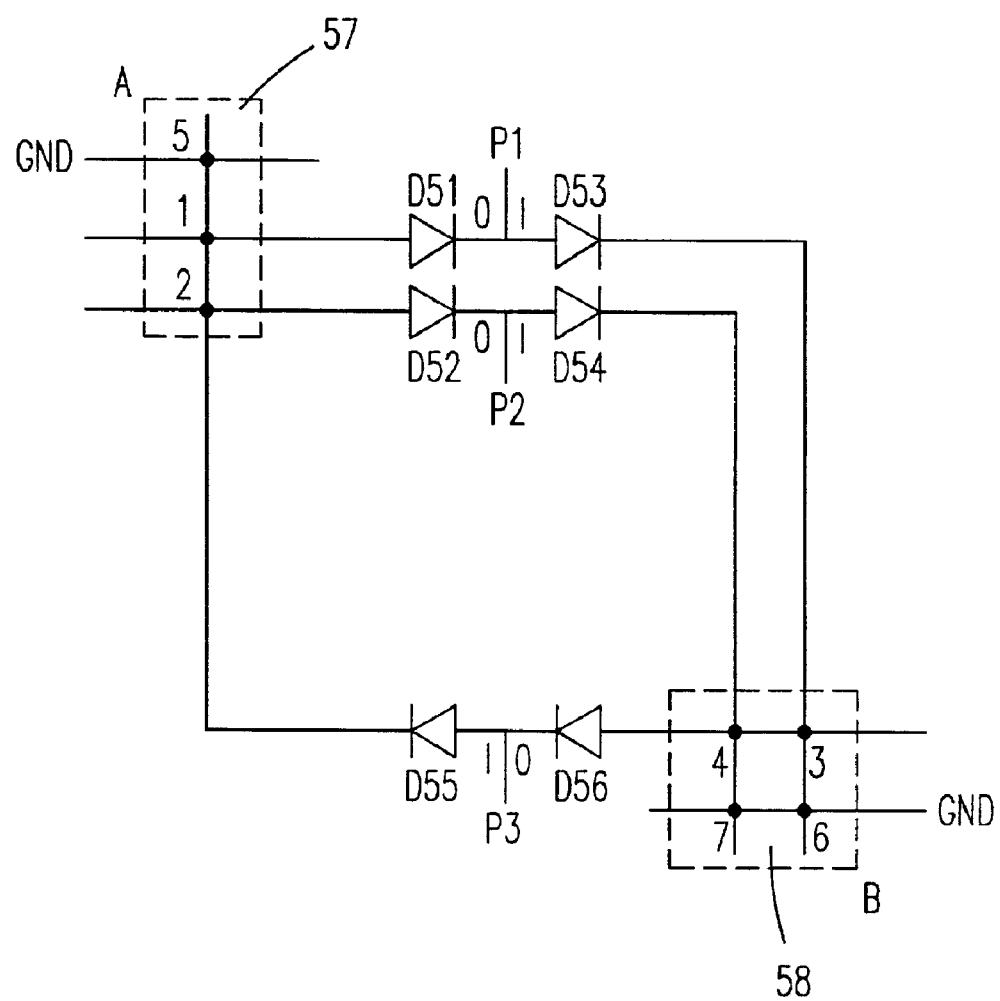
FIG. 5 shows a schematical view of a circuit in another preferred embodiment according to the present invention when the number of the keyboard input/outputs is three.
Figure 6:
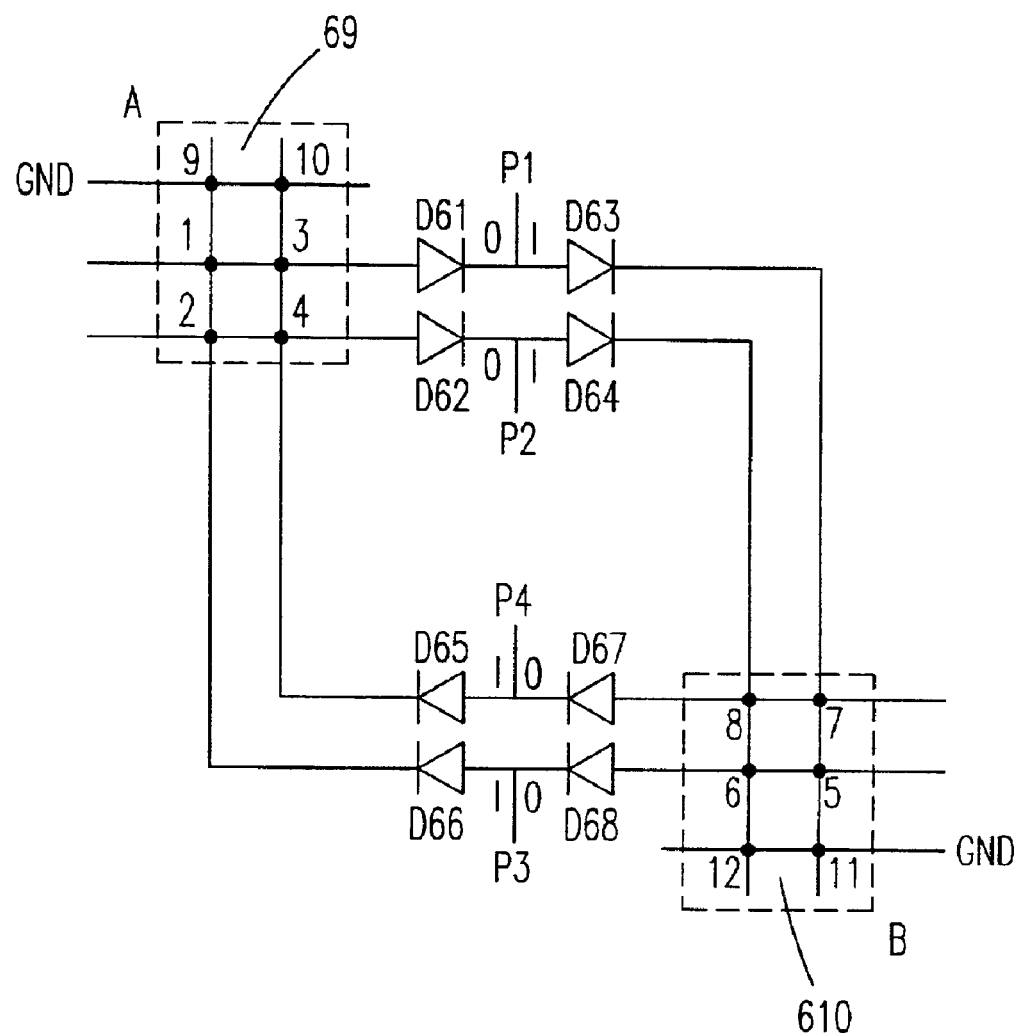
FIG. 6 shows a schematical view of a circuit in further preferred embodiment according to the present invention when the number of the keyboard input/outputs is four.
Figure 7:
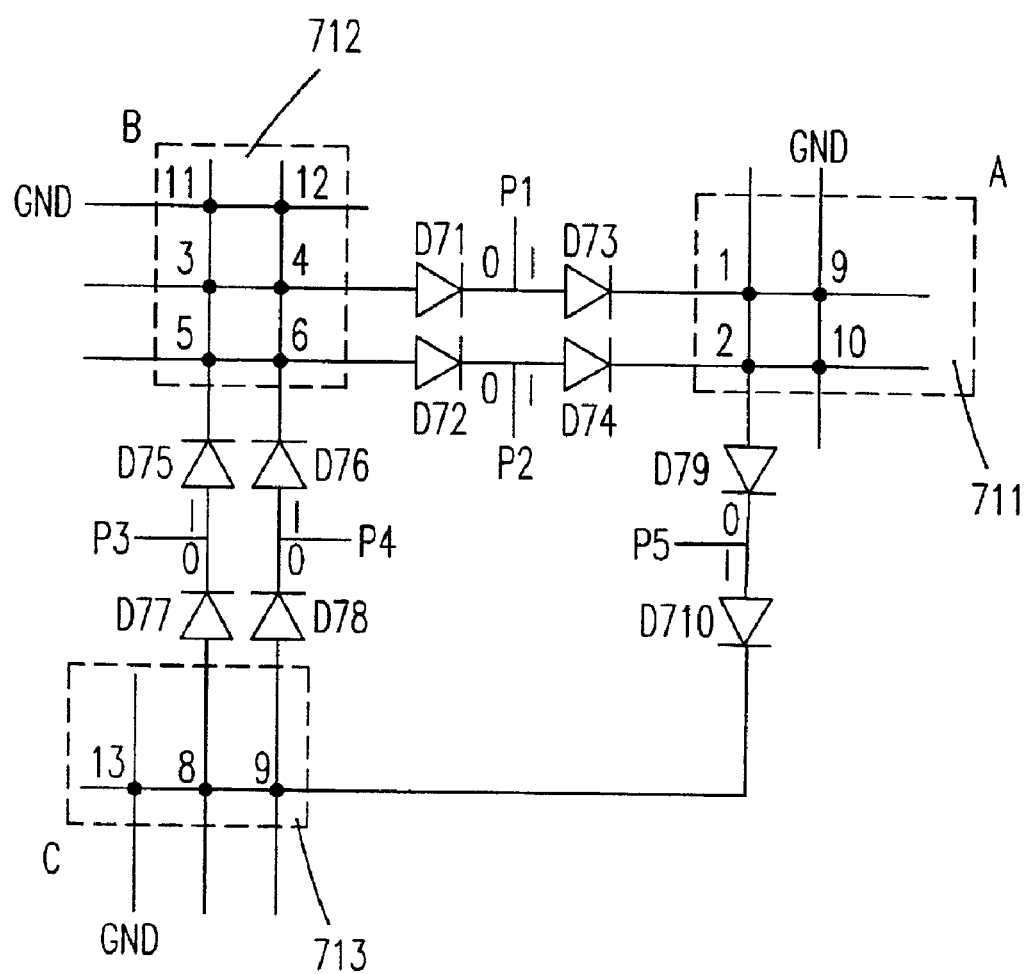
FIG. 7 shows a schematical view of a circuit in another further preferred embodiment according to the present invention when the number of the keyboard input/outputs is five.
Figure 8:
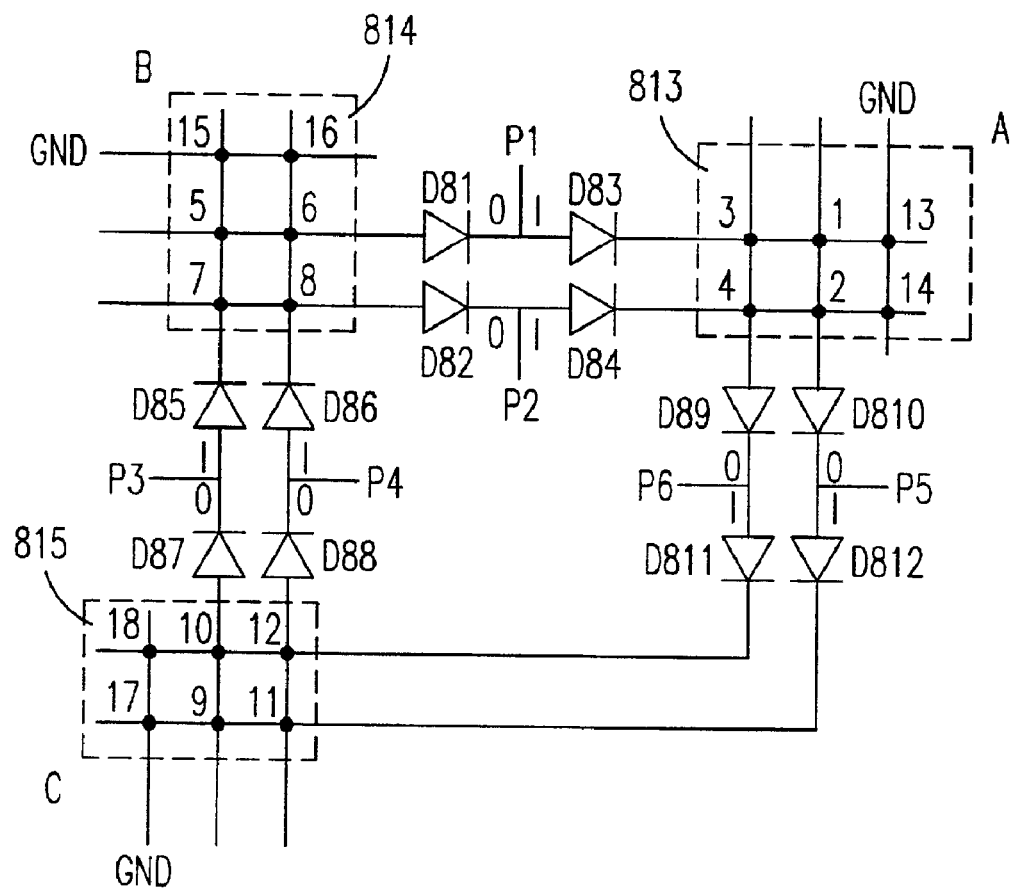
FIG. 8 shows a schematical view of a circuit in further another preferred embodiment according to the present invention when the number of the keyboard input/outputs is six.

Please refer to FIG. 3. FIG. 3 shows a schematical view of the smallest scan matrix circuit in the keyboard scan circuit according to the present invention. The matrix is constituted by four keyboard input/output ports (P1~P4), each of which can be selected from a group consisting of an input mode, an output mode, and a floating mode, and four diodes (D31~D34) to form one rectangular matrices (35) in which there are six detectable input terminals (1~6) and two synchronously detectable input terminals (any two of 1, 2, 3, and 4) therein.

Assuming that the scan time is separated to T1 and T2, P1 and P2 are set in the output mode, and P3 and P4 are set in the input mode. Consequently, the terminals 5 and 6 will be detected at T1, and the terminals 1, 2, 3, and 4 will be detected at T2. Because of the diodes (D31~D34) in the matrix A (35) being the current-ioslating elements, when the terminals (any two of 1, 2, 3, and 4) in the matrix A (35) are under operation, the other terminals in the matrix A (35) will not be influenced, and the purpose of synchronously input can be achieved thereby.

Please refer to FIGS. 4(a)–4(e). FIGS. 4(a)–4(e) show the chematical views of the scan circuit according to the present invention while the number of the keyboard input/output ports is eight. The circuit is constituted by eight keyboard input/output ports (P1~P8), each of which can be selected from a group consisting of an input mode, an output mode, and a floating mode, and four diodes (D41~D44) to form eight rectangular matrices (433~440) in which there are 40 detectable input terminals (1~40) and eight synchronously detectable input terminals (any two of 1, 2, 3, and 4, any two of 5, 6, 7, and 8, and any two of 13, 14, 15, and 16) therein. It is worth to be noticed that the circuit is a three-dimensional circuit which is trying to increase the number of rectangular matrices (433~440) via across connection (P1, P2, P3, and P4, P5 and P6, and P3, P4, P7, and P8). And thus the number of the detectable input terminals (1~40) and the synchronously detectable input terminals can be increased greatly.

The scan method of the circuit includes steps of: (a) scanning one rectangular matrix which is selected from the eight ones (433~440); (b) setting one of the eight keyboard input/output ports in an input mode, another in an output mode, and the residuary others in a floating mode; (c) scanning the input terminals of the rectangular matrix linking with the ground terminal at the first time period; (d) scanning the input terminals of the rectangular matrix unlinking with the ground terminal at the second time period; (e) checking the keyboard input/output ports which were set to input mode and determining which the keys are pressed according to the electrical potential difference produced by the ports in the input mode; and repeating the steps from (a) to (e), so as to scan the eight rectangular matrices one by one.

Assuming that the scan time is separated to T1 and T2, P1 and P2 are set in the output mode, and P3 and P4 are set in the input mode. Firstly, the matrix A 433 will be scanned, so that the terminal 1, 2, 3, 4, 17, and 18 will be detected. The terminals 17 and 18 will be detected at T1 and the terminals 1, 2, 3, and 4 will be scanned at T2. The same as described above, because of the diodes (D41~D432) in the matrix A (433) and the other matrices (434~440) being the current-isolating elements, when the terminals (any two of 1, 2, 3, and 4) in the matrix A (433) are under operation, the other terminals in the other matrices (434~440) will not be influenced, and the purpose of synchronously input can be achieved thereby. After the matrix A (433) is scanned, the other matrices (434~440) will be scanned one by one by the method described above to reach the purpose of synchronously input.

The combinations of the keyboard input/output ports in the present invention are not being limited in eight ones and the frame of the combinations can be amplified or abbreviated. The circuits of the other preferred embodiments are shown in FIGS. 5~8. Utilizing the same theory, the purpose of synchronously input can be reached. Based on FIGS. 5~8, the number of the diodes used in the present invention can be calculated. Assuming that the number a plurality of keyboard input/output ports is m. The number of the diodes is 2m while the number of m is from two six, and the number of the diodes is 4m while the number of m is more than seven.

Tables 1 and 2 are the contrast tables of the number of the detectable input terminals and the synchronously detectable input terminals according to the present invention and in the prior art. According to Tables 1 and 2, no matter the number of the detectable input terminals or the number of the synchronously detectable input terminals, the numbers in the present invention are greater than that in the prior art. Especially, when the number of the ports are getting more and more, the difference will become greater.

Table 1: the number of the detectable input terminals.

TABLE 1

| the number of the detectable input terminals. | | | | | | | |
|---|---|---|---|---|---|---|---|
| The number of the input/output ports | 2 | 3 | 4 | 5 | 6 | 7 | 8 |
| Prior art | 2 | 3 | 4 | 6 | 9 | 12 | 16 |
| Present invention | 4 | 7 | 12 | 13 | 18 | 31 | 40 |

Table 2: the number of the synchronously detectable input terminals.

TABLE 2

| the number of the synchronously detectable input terminals. | | | | | | | |
|---|---|---|---|---|---|---|---|
| The number of the input/output ports | 2 | 3 | 4 | 5 | 6 | 7 | 8 |
| Prior art | 2 | 3 | 4 | 2 | 2 | 2 | 2 |
| Present invention | 2 | 4 | 4 | 6 | 6 | 8 | 8 |

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A keyboard scan circuit for a device receiving plural inputs simultaneously, comprising:
    a plurality of keyboard input/output ports, each of which is set in one selected from a group consisting of an input mode, an output mode, and a floating mode for receiving one of said plural inputs;
    a plurality of rectangular matrices including a plurality of detectable input terminals and a plurality of synchronously detectable input terminals and formed by means of cross-linking said keyboard input/output ports; and
    a plurality of current-isolating elements electrically connected between said keyboard input/output ports and said rectangular matrices for mutually isolating signals of said rectangular matrices.

2. The scan circuit as claimed in claim 1, further comprising a ground terminal for forming said rectangular matrices by means of cross-linking said keyboard input/ output ports therewith, so as to increase the number said detectable input terminals.

3. The circuit as claimed in claim 1, wherein said device providing keys to be operated simultaneously is an electronic organ with black and white keys.

4. The circuit as claimed in claim 1, wherein said plurality of keyboard input/output ports are those on a chip.

5. The circuit as claimed in claim 1, wherein said plurality of current-isolating elements are diodes.

6. The circuit as claimed in claim 5, wherein when the number said keyboard input/output ports is m, the number said diodes is 2m while a range of m is from two to six; and said number of said diodes is 4m while the number m is more than seven.

7. The circuit as claimed in claim 5, wherein said diodes operated under a one-way conductance characteristic mutually isolated signals of said plurality of rectangular matrices.

8. A keyboard scan method for a device having keys to be operated simultaneously to receive plural inputs simultaneously, and including a keyboard scan circuit having a plurality of keyboard input/output ports, ground terminals, a plurality of rectangular matrices having plurality input terminals and formed by means of cross-linking said keyboard input/output ports, and a plurality of current-isolating elements electrically connected between said keyboard input/output ports and said rectangular matrices, the method comprising steps of:
    selecting one of said plurality of rectangular matrices to be scanned;
    setting one portion of said keyboard input/output ports in an input mode, setting another portion of said ports in an output mode, and setting the others of said ports in a floating mode;
    scanning said input terminals of said rectangular matrix linking with said ground terminal at a first time period;
    scanning said input terminals of said rectangular matrix unlinking with said ground terminal at a second time period;
    checking said keyboard input/output ports which were set to said input mode and determining which said keys are pressed according to an electrical potential difference produced by said ports in said input mode; and
    repeating said steps, so as to scan said rectangular matrices one by one.

9. The method as claimed in claim 8, wherein said device providing keys to be operated simultaneously is an electronic organ with black and white keys.

10. The method as claimed in claim 8, wherein said plurality of keyboard input/output ports are those on a chip.

11. The method as claimed in claim 8, wherein said plurality of current-isolating elements are diodes.

12. The method as claimed in claim 11, wherein when the number said keyboard input/output ports is m, the number said diodes is 2m while a range of m is from two to six; and said number of said diodes is 4m while the number m is more than seven.

13. The method as claimed in claim 11, wherein said diodes operated under a one-way conductance characteristic mutually isolate signals of said plurality of rectangular matrices.

14. The method as claimed in claim 8, wherein said input terminals of said rectangular matrices unlinking with said ground terminals are synchronously detectable input terminals.

* * * * *